(12) United States Patent
Kloth et al.

(10) Patent No.: US 10,219,376 B2
(45) Date of Patent: Feb. 26, 2019

(54) LIGHT-EMITTING DIODE APPARATUS AND METHOD FOR MANUFACTURING A LIGHT-EMITTING DIODE APPARATUS

(71) Applicant: JENOPTIK Polymer Systems GmbH, Triptis (DE)

(72) Inventors: Bernd Kloth, Birkenwerder (DE); Matthias Fluegel, Berlin (DE); Roman Jaikow, Berlin (DE)

(73) Assignee: JENOPTIK Polymer Systems GmbH, Triptis (DE)

( * ) Notice: Subject to any disclaimer, the term of this patent is extended or adjusted under 35 U.S.C. 154(b) by 0 days.

(21) Appl. No.: 15/552,970

(22) PCT Filed: Feb. 23, 2016

(86) PCT No.: PCT/EP2016/053701
§ 371 (c)(1),
(2) Date: Aug. 23, 2017

(87) PCT Pub. No.: WO2016/135110
PCT Pub. Date: Sep. 1, 2016

(65) Prior Publication Data
US 2018/0279475 A1    Sep. 27, 2018

(30) Foreign Application Priority Data
Feb. 23, 2015   (DE) .................. 10 2015 002 099

(51) Int. Cl.
*F21V 15/00*   (2015.01)
*H05K 1/14*    (2006.01)
(Continued)

(52) U.S. Cl.
CPC ......... *H05K 1/145* (2013.01); *H01L 25/0753* (2013.01); *H01L 25/165* (2013.01);
(Continued)

(58) Field of Classification Search
CPC ............ G09F 9/33; G09F 13/04; G09F 9/302;
H05K 1/14; H01L 33/48
See application file for complete search history.

(56) References Cited

U.S. PATENT DOCUMENTS 4,058,919 A * 11/1977 Wakabayashi ............ G09F 9/33
40/451
6,252,350 B1 * 6/2001 Alvarez .................. G09F 13/22
257/79
(Continued)

FOREIGN PATENT DOCUMENTS

DE   2020110505596 U1   8/2012
EP         0103255 A2   3/1984
EP         1696404 A1   8/2006

OTHER PUBLICATIONS

International Search Report dated May 20, 2016.

*Primary Examiner* — Ali Alavi
(74) *Attorney, Agent, or Firm* — Muncy, Geissler, Olds & Lowe, P.C.

(57) ABSTRACT

A light-emitting diode apparatus (100) comprises a light-emitting diode element (102) having a front (106) and a back (128), wherein the front (106) has an emission region (108) for emitting electromagnetic waves (110) and a diode connection contact (112) that is associated with the emission region (108), and comprises a printed circuit board (104) having a passage opening (114) and a plate connection contact (118), wherein the front (106) of the light-emitting diode element (102) is connected to the printed circuit board (104), and wherein the emission region (108) is arranged opposite the passage opening (114) and the diode connection contact (112) is arranged opposite the plate connection contact (118) and is electrically conductively connected to the plate connection contact (118). A cover unit (120) having a recess (122) for holding the light-emitting diode element (Continued)

(102) is connected to the printed circuit board (104), wherein the cover unit (120) is formed from a further printed circuit board.

17 Claims, 10 Drawing Sheets

(51) Int. Cl.
    *H01L 25/075*     (2006.01)
    *H01L 25/16*     (2006.01)
    *H01L 33/62*     (2010.01)
    *H05K 1/18*     (2006.01)
    *H05K 3/30*     (2006.01)

(52) U.S. Cl.
    CPC ............ *H01L 25/167* (2013.01); *H01L 33/62* (2013.01); *H05K 1/144* (2013.01); *H05K 1/181* (2013.01); *H05K 3/303* (2013.01); *H01L 2933/0066* (2013.01); *H05K 2201/042* (2013.01); *H05K 2201/09072* (2013.01); *H05K 2201/10106* (2013.01); *H05K 2201/10424* (2013.01); *H05K 2201/10522* (2013.01); *H05K 2201/10545* (2013.01)

(56) References Cited

U.S. PATENT DOCUMENTS

| | | | |
|---|---|---|---|
| 7,339,200 B2* | 3/2008 | Amano | ............... G02B 3/02 257/98 |
| 2002/0175421 A1 | 11/2002 | Kimura | |
| 2007/0285917 A1 | 12/2007 | Wadia et al. | |
| 2008/0142961 A1* | 6/2008 | Jones | ............... H01L 25/165 257/724 |

\* cited by examiner

LIGHT-EMITTING DIODE APPARATUS AND METHOD FOR MANUFACTURING A LIGHT-EMITTING DIODE APPARATUS

This nonprovisional application is a National Stage of International Application No. PCT/EP2016/053701, which was filed on Feb. 23, 2016, and which claims priority to German Patent Application No. 10 2015 002 099.4, which was filed in Germany on Feb. 23, 2015, and which are both herein incorporated by reference.

BACKGROUND OF THE INVENTION

Field of the Invention

The present invention relates to a light-emitting diode apparatus and a method for producing a light-emitting diode apparatus.

Description of the Background Art

LED chips are either encapsulated in discrete housings having transparent windows or lenses or are mounted, together with other chips, on a carrier printed circuit board made of glass fiber-reinforced epoxy resin or ceramic, for example. In this case, for the purpose of electrical contact-connection, the individual chips are electrically conductively adhesively bonded or soldered to the underside and bonded to the top side using aluminum or gold wire.

A printed circuit board is the most commonly used connection element for electronic components. Said printed circuit board is characterized by electrically conductive, tightly adhering connections in or on an insulating material and additionally serves as a component carrier. Information for mounting, testing and servicing can be printed thereon. Technical requirements and profitability determine the various embodiments of the printed circuit board. Said printed circuit board in the context of the present invention can also comprise different insulating materials, laminates and materials. Classifications and classes of printed circuit boards can differ according to thermal conductivity and coefficients of heat transfer. A distinction is also made in accordance with classification according to base material, electronic printed circuit board and according to end product.

The examples mentioned make no claim to completeness and are therefore also non-exhaustive within the scope of protection of the claim.

For example, single-line or multi-line display arrays are thus generated by arranging a plurality of display LED chips on a printed circuit board (for example PCB or ceramic). A further possibility for generating LED chip arrays lies in the monolithic arrangement of a plurality of, for example, 7-segment digits on a chip.

EP 103255 A2 describes a multi-digit, electrical numeric display device for displaying quantities and prices at fuel filling stations. Electromagnetically drivable flap display modules are provided, which are arranged on a printed circuit board together with all the components of the electronic control circuit, said printed circuit board being able to be used in a simple, trough shape and which is able to be cast using a fluid, post-curable casting resin to form a gas-tight block.

SUMMARY OF THE INVENTION

Against this background, the present invention presents a light-emitting diode apparatus and a method for producing a light-emitting diode apparatus as claimed in the main claims. Advantageous refinements emerge from the respective subclaims and the following description.

An electrical contact-connection of a light-emitting diode element to the emission side face down on a printed circuit board having an opening for a free view of the emission region makes it possible to realize a miniaturized and cost-effective light-emitting diode apparatus.

In contrast to previously conventional chip and wire bonding, producing the light-emitting diode apparatus using the design presented here requires just one mounting step. The LED chip arrangement presented herein can be realized, in particular, without sensitive bonding wires, which usually still have to be protected by an additional potting or a covering cap. Furthermore, the LED chips soldered to the top side face down can be embedded between two printed circuit boards and thereby be configured to be very resilient to mechanical effects.

Moreover, the lateral installation space can be reduced due to the lack of wire bonds and thereby a higher chip density both in the x-axis and the y-axis can be achieved.

The proposed light-emitting diode elements can be used, for example, as LED display chips, wherein, as a result of the arrangement proposed here, when viewed through the opening in the carrier printed circuit board, there are no interference reflections from bonding wires or conductor track structures. In particular, given the proposed form of mounting and when using vertical plated through-holes, single-line or multi-line LED display chip arrangements can be mounted in a particularly dense manner in multilayer printed circuit boards, which permits a higher information density than previously when mirroring LED display arrays in optical beam paths.

A light-emitting diode apparatus has the following features: a light-emitting diode element having a front side and a rear side, wherein the front side has an emission region for the purpose of emitting electromagnetic waves and a diode connection contact associated with the emission region; and a printed circuit board having a through-opening and a board connection contact, wherein the front side of the light-emitting diode element is connected to the printed circuit board, and wherein the emission region is arranged opposite the through-opening and the diode connection contact is arranged opposite the board connection contact and is electrically conductively connected to the board connection contact.

The light-emitting diode element can be an LED chip or a part of an LED chip. The emission region can be configured to emit light in the visible range or in the UV range in response to a flow of electric current through the light-emitting diode element. The diode connection contact can be the cathode or the anode of the light-emitting diode element. The diode connection contact can be arranged adjacent to the emission region. The board connection contact of the printed circuit board can be configured to supply the diode connection contact with voltage.

In accordance with one embodiment of the light-emitting diode apparatus, the front side of the light-emitting diode element can have a further emission region for the purpose of emitting further electromagnetic waves and a further diode connection contact associated with the further emission region. Accordingly, the printed circuit board can have a further board connection contact. In this case, the further emission region can be arranged opposite the through-opening and the further diode connection contact can be arranged opposite the further board connection contact and be electrically conductively connected to the further board connection contact. The light-emitting diode apparatus can therefore advantageously be used as a display LED for the purpose of displaying text and/or numerical information.

In accordance with the invention, the light-emitting diode apparatus has a covering unit. The covering unit has a recess for the purpose of receiving the light-emitting diode element and can be connected to the printed circuit board. Here, the light-emitting diode element can be arranged in the recess. The covering unit having the recess can serve for protection and/or electrical contact-connection of the light-emitting diode element.

In particular, a depth of the recess can exceed a thickness of the light-emitting diode element. It is therefore possible, in the finished light-emitting diode apparatus, for the light-emitting diode element to stand back with respect to an outer side surface of the light-emitting diode apparatus and to be better protected from any damage during use of the light-emitting diode apparatus.

The covering unit is composed, for example, of a further printed circuit board and a frame element that abuts the further printed circuit board. Here, the recess is formed by a passage opening in the frame element. The covering unit can advantageously be produced quickly, inexpensively and using standard components. Moreover, additional functionalities can be integrated into the light-emitting diode apparatus by means of the further printed circuit board.

In accordance with a further embodiment of the light-emitting diode apparatus, the rear side of the light-emitting diode element can have a second diode connection contact. Accordingly, the printed circuit board can have a second board connection contact and the covering unit can have a covering unit contact, a further covering unit contact and an electrical line that electrically conductively connects the covering unit contacts. The covering unit contact can be arranged opposite the second diode connection contact and can be electrically conductively connected to the second diode connection contact. The further covering unit contact can be arranged opposite the second board connection contact and can be electrically conductively connected to the second board connection contact. This embodiment permits rear-side contact-connection of the light-emitting diode element, for which inexpensive standard diode elements can advantageously be used. In addition, this form of contact-connection offers better protection for the second diode of the light-emitting diode element used.

Alternatively, the front side of the light-emitting diode element can have a second diode connection contact associated with the emission region. The printed circuit board can have a second board connection contact, and the second diode connection contact can be arranged opposite the second board connection contact and be electrically conductively connected to the second board connection contact. This form of electrical connection of the light-emitting diode element permits quick and inexpensive finishing of the light-emitting diode apparatus by saving on the rear-side contact-connection.

The light-emitting diode apparatus can be fitted with at least one additional light-emitting diode element. Accordingly, the printed circuit board can have at least one additional through-opening and at least one additional board connection contact. An additional emission region of the additional light-emitting diode element can be arranged opposite the additional through-opening and an additional diode connection contact of the additional light-emitting diode element can be arranged opposite the additional board connection contact and be electrically conductively connected to the additional board connection contact. In this embodiment, the light-emitting diode apparatus can be readily used for the purpose of displaying more complex information, such as text or numbers, for example.

The light-emitting diode apparatus can also have a driver circuit for the purpose of driving the light-emitting diode element and at least one driver contact for the purpose of electrically contact-connecting the driver circuit. The driver circuit and the driver contact can be arranged on the printed circuit board. The light-emitting diode element can therefore advantageously be driven locally using short signal paths. It is also possible to provide a plurality of driver circuits.

The driver circuit can advantageously be arranged on the rear side of the printed circuit board. Likewise advantageously, the driver circuit can be arranged on the further printed circuit board, particularly advantageously on the rear side thereof, that is to say the side that lies opposite the light-emitting diode element. The further printed circuit board can have a plurality of driver contacts for the purpose of electrically contact-connecting the driver circuit. The frame element and/or the further printed circuit board can advantageously have plated through-holes and/or conductor tracks.

A method for producing a light-emitting diode apparatus has the following steps: providing a light-emitting diode element having a front side and a rear side, wherein the front side has an emission region for the purpose of emitting electromagnetic waves and a diode connection contact associated with the emission region; providing a printed circuit board having a through-opening and a board connection contact; and joining the light-emitting diode element to the printed circuit board, wherein the front side of the light-emitting diode element is connected to the printed circuit board, and wherein the emission region is arranged opposite the through-opening and the diode connection contact is arranged opposite the board connection contact and is electrically conductively connected to the board connection contact.

The steps of a variant of the method presented here can be carried out in appropriate devices in a production plant in a fully automated or a partly automated manner. The object on which the invention is based can also be achieved quickly and efficiently by this embodiment variant of the invention in the form of a method.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
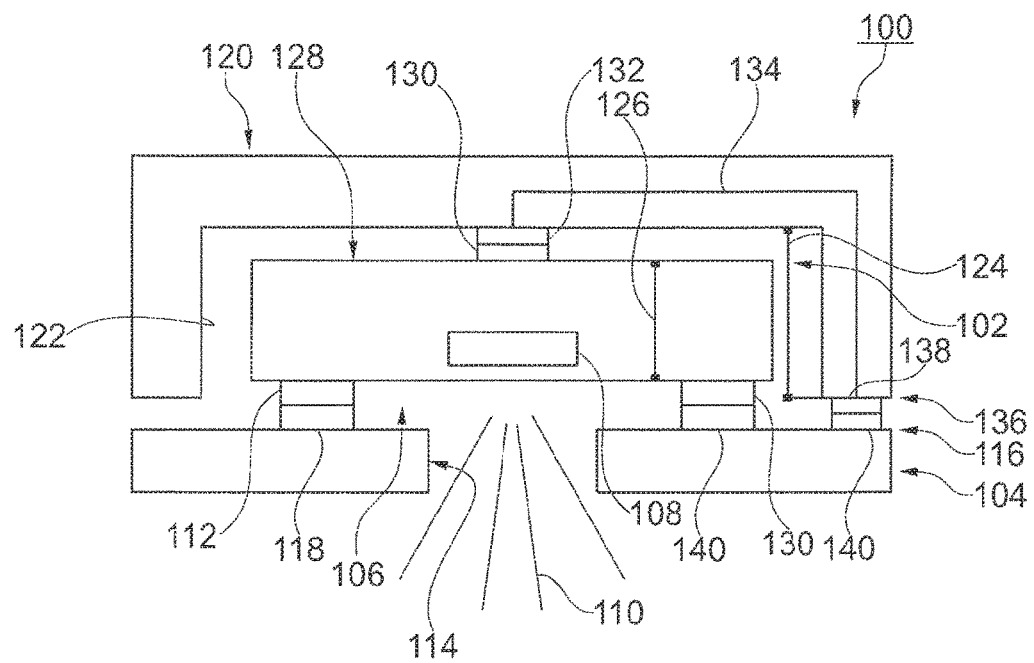
FIG. 1 shows a schematic illustration of a light-emitting diode apparatus in accordance with an exemplary embodiment of the present invention.

In the following description of advantageous exemplary embodiments of the present invention, identical or similar reference numerals are used for the similarly functioning elements illustrated in the various figures, wherein these elements will not be described again.

FIG. 1 shows a schematic illustration of a light-emitting diode apparatus 100 in accordance with an exemplary embodiment of the present invention. The light-emitting diode apparatus 100 comprises a light-emitting diode element 102 and a printed circuit board 104. The light-emitting diode apparatus 100 can be an LED chip or a part of an LED chip for the purpose of displaying text or number information. The printed circuit board 104 is used for the purpose of mechanically securing and electrically connecting the light-emitting diode element 102. Another suitable carrier substrate can also be used instead of the printed circuit board 104.

A front side 106 of the light-emitting diode element 102 has an emission region 108 for the purpose of emitting electromagnetic waves 110, for example light, said front side being illustrated directed downward in the illustration in FIG. 1. The front side 106 further has a diode connection contact 112 associated with the emission region 108. In the exemplary embodiment shown in FIG. 1, the diode connection contact 112 forms the anode of the light-emitting diode element 102. The diode connection contact 112 is adjacent to the emission region 108 on the front side 106 of the light-emitting diode element 102.

The printed circuit board 104 has a through-opening 114. In the stacked arrangement of the printed circuit board 104 and light-emitting diode element 102 shown in FIG. 1, the light-emitting diode element 102 is arranged on the printed circuit board 104 in such a way that the emission region 108 lies opposite the through-opening 114. When a current flows through the light-emitting diode element 102, the electromagnetic waves 110 can therefore emit freely—downwards in the illustration in FIG. 1. The printed circuit board 104 further has a board connection contact 118 on a side 116 facing the light-emitting diode element 102 in the arrangement shown in FIG. 1. In the arrangement shown in FIG. 1, the board connection contact 118 is arranged opposite the diode connection contact 112 and is electrically conductively connected thereto. By means of the connection contacts 112, 118, the light-emitting diode element 102 abuts the printed circuit board 104 with the front side 106 thereof and is connected to said printed circuit board.

In the exemplary embodiment of the light-emitting diode apparatus 100 shown in FIG. 1, the stacked arrangement of the printed circuit board 104 and light-emitting diode element 102 is extended by a covering unit 120, which is arranged so as to adjoin the light-emitting diode element 102. On a side facing the light-emitting diode element 102, the covering unit 120 has a recess 122, which receives the light-emitting diode element 102. The light-emitting diode element 102 is therefore covered by the covering unit 120 in a hood-like manner. The recess 122 is a depression in the covering unit 120, said depression corresponding in terms of its shape to the light-emitting diode element 102 but having larger dimensions than said light-emitting diode element for the purpose of suitably receiving the light-emitting diode element 102. In particular, a depth 124 of the recess 122 is greater than a thickness 126 of the light-emitting diode element 102. In the exemplary embodiment shown in FIG. 1, the covering unit 120 is embodied in one part.

In the exemplary embodiment of the light-emitting diode apparatus 100 shown in FIG. 1, the light-emitting diode element 102 is electrically contact-connected by means of the front and rear side. Accordingly, a rear side 128 of the light-emitting diode element 102 has a second diode connection contact 130. In the exemplary light-emitting diode element 102 in FIG. 1, the second diode connection contact 130 forms the cathode. The covering unit 120 has a covering unit contact 132 in the recess 122. The covering unit contact 132 is arranged opposite the second diode connection contact 130 and electrically conductively connected thereto.

In order to supply the contact group 130, 132 with voltage, the covering unit contact 132 is electrically conductively connected to a further contact group 136 by means of an electrical line 134, for example a metallization, that is laid in the covering element 120. The further contact group 134 here is a further covering unit contact 138 and a second board connection contact 140 that is arranged on the side 116 of the printed circuit board 104 facing the light-emitting diode element 102, like the first board connection contact 118. The further covering unit contact 138 is electrically conductively connected to the electrical line 134. The further covering unit contact 138 and the second board connection contact 140 are arranged opposite one another in the apparatus 100 and electrically conductively connected.

The rear-side contact-connection of the second diode connection contact 130 of the light-emitting diode element 102 is optional. In accordance with an alternative exemplary embodiment, both the anode 112 and the cathode 130 of the light-emitting diode element 102 can be contact-connected on the front side. This embodiment is likewise shown by way of example in FIG. 1.

In order to contact-connect the cathode 130 of the light-emitting diode element 102 on the front side, the second diode connection contact 130 is arranged on the front side 106 of the light-emitting diode element 102, like the first diode connection contact 112. In the exemplary embodiment shown in FIG. 1, the second diode connection contact 130 is located adjacent to the emission region 108, with the result that the emission region 108 is positioned between the diode connection contact 112 and the second diode connection contact 130. In accordance with this option, the second board connection contact 140 abuts the main side 116 of the printed circuit board 104 in such a way that the second diode connection contact 130 and the second board connection contact 140 lie opposite one another and are electrically contact-connected.

In this second option of contact-connecting the light-emitting diode element 102, the covering unit 120 serves only to secure and/or protect the light-emitting diode element 102 from mechanical influences from the outside.

The anode 112 and the cathode 130 of the light-emitting diode element 102 can also be interchanged in accordance with exemplary embodiments.

Figure 2:
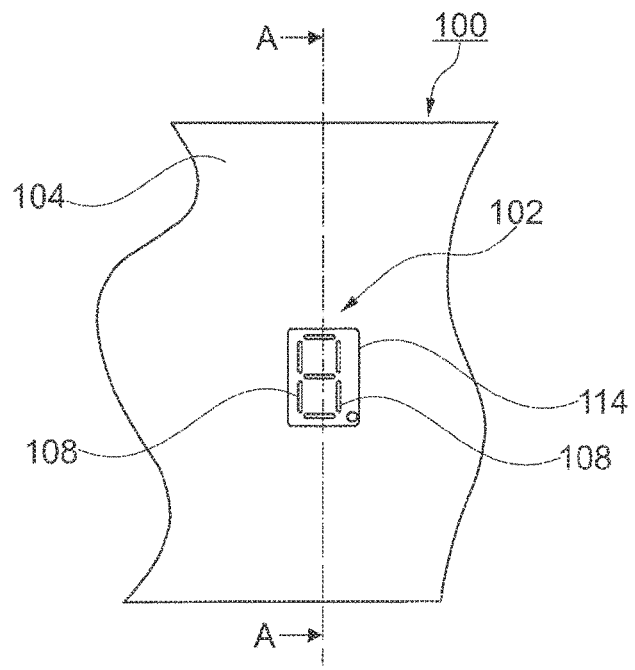
FIG. 2 shows a plan view of a light-emitting diode apparatus in accordance with a further exemplary embodiment of the present invention.

FIG. 2 shows a plan view of a further exemplary light-emitting diode apparatus 100 in accordance with the design presented here. Said figure shows a section of the printed circuit board 104 having the through-opening 114, which uncovers the view of a multiplicity of seven emission regions 108 of the light-emitting diode element 102 that is arranged behind the printed circuit board 104 in the illustration in FIG. 2. In the exemplary embodiment of the light-emitting diode apparatus 100 shown in FIG. 2, the emission regions 108 form a display of a light-emitting diode element or LED chip 102 that is embodied as a 7-segment-display diode. Only two of the total of seven emission regions 108 are provided with a reference numeral in the illustration for the sake of clarity. Said specific embodiment of the light-emitting diode element 102 as a 7-segment-display diode is dealt with in more detail with reference to the following figures. Only one of the multiplicity of contact-connections of the 7-segment-display diode is explained below for the sake of clarity.

Figure 3:
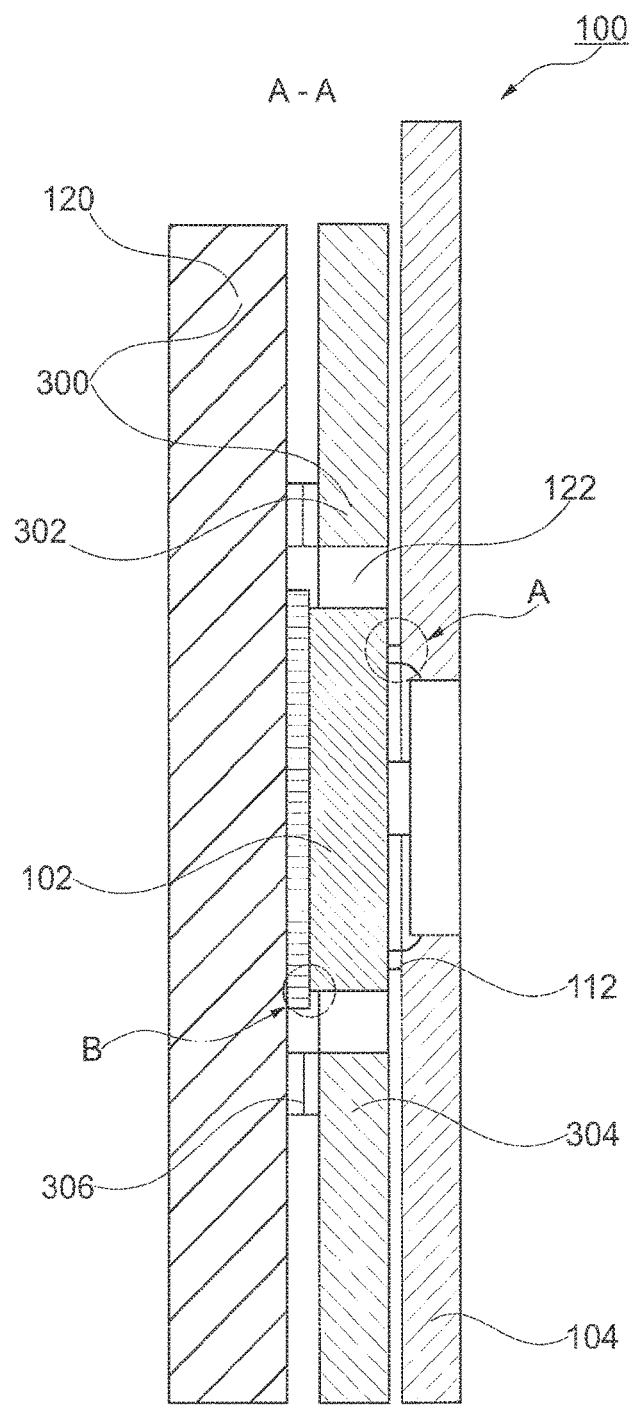
FIG. 3 shows a sectional illustration of the light-emitting diode apparatus from FIG. 2 in accordance with a further exemplary embodiment of the present invention.

FIG. 3 shows a sectional illustration of the exemplary light-emitting diode apparatus 100 from FIG. 2 along a sectional line A-A in FIG. 2. Here, the stacked construction of the printed circuit board 104, light-emitting diode element or LED chip 102 and covering unit 120 can be readily seen. The covering unit 120 can also be referred to as a covering plate.

In contrast to the exemplary embodiment shown in FIG. 1, in the exemplary light-emitting diode apparatus 100 shown in FIG. 3, the covering unit 120 is embodied in two parts and is composed of a further printed circuit board 300 and a frame element 302 that abuts the further printed circuit board 300. In this case, the recess 122 for receiving the light-emitting diode element 102 is formed by a passage opening 304 in the frame element 302. The frame element 302 hence fulfills the aim of a spacing plate between the printed circuit board 104 and the further printed circuit board 300 for the purpose of accommodating the LED chip 102 between the printed circuit boards 104, 300.

As the illustration in FIG. 3 shows, the further printed circuit board 300 and the frame element 302 are coupled to one another by means of small connecting plates 306 that are arranged between them. As the illustration in FIG. 3 shows, the recess 122 that is formed by the further printed circuit board 300 and the frame element 302 also has here a depth that is greater than a thickness of the LED chip 102.

In the exemplary embodiment of the light-emitting diode apparatus 100 shown in FIG. 3, the light-emitting diode element 102 is electrically and mechanically contact-connected on the front side to the anode 112. The cathode—not shown in FIG. 3—is electrically contact-connected to the covering plate 120 and guided by means of plated through-holes—likewise not shown in FIG. 3—in the frame element 302 to the front side of the light-emitting diode element 102.

Figure 4:
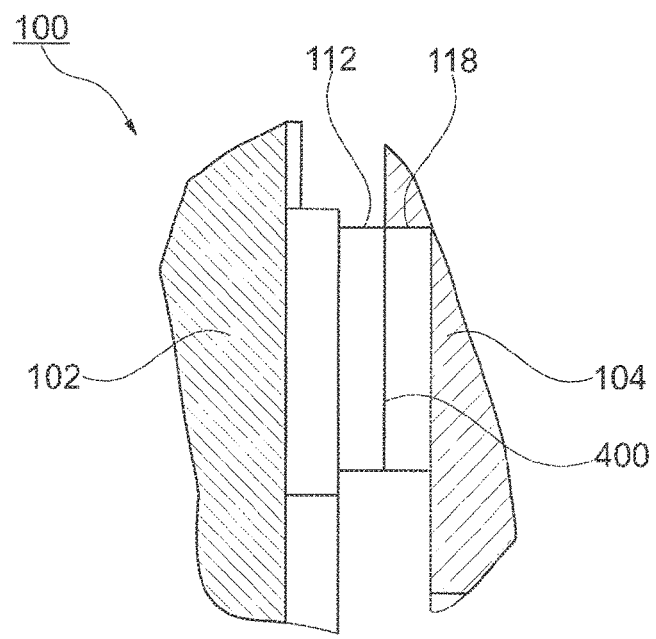
FIG. 4 shows a portion of a detail of the light-emitting diode apparatus from FIG. 3 in accordance with an exemplary embodiment of the present invention.

FIG. 4 shows a section of a detail of the exemplary light-emitting diode apparatus 100, said section of a detail being denoted with the reference numeral A in FIG. 3. The electrical and mechanical connection between the LED chip 102 and the printed circuit board 104 is shown. It can clearly be seen that the first diode connection contact 112 of the LED chip 102 and the first board connection contact 118 of the printed circuit board 104 lie opposite one another in a precisely aligned manner and touch one another at a common interface 400. The first diode connection contact 112 and the first board connection contact 118 are electrically and mechanically connected to one another by means of the interface 400.

Figure 5:
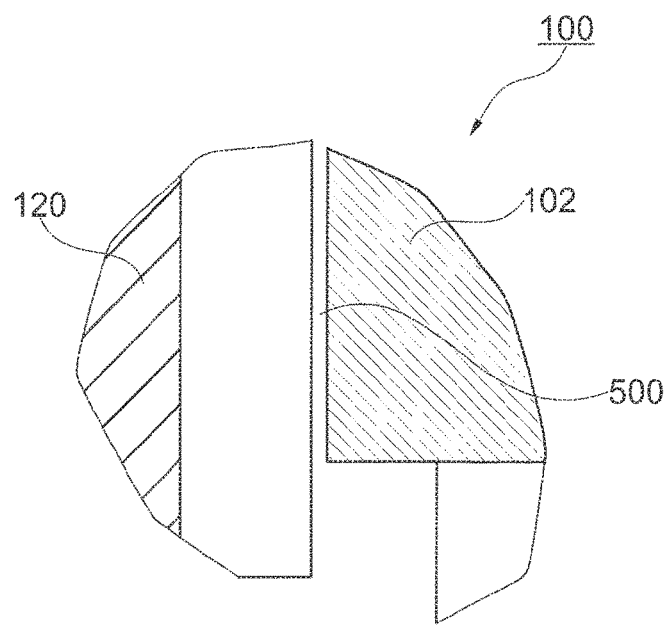
FIG. 5 shows a further portion of a detail of the light-emitting diode apparatus from FIG. 3 in accordance with an exemplary embodiment of the present invention.

FIG. 5 shows a further section of a detail of the exemplary light-emitting diode apparatus 100, said section of a detail being denoted with the reference numeral B in FIG. 3. The electrical and mechanical connection between the LED chip 102 and the covering plate 120 is shown. In the exemplary embodiment of the light-emitting diode apparatus 100 shown, an electrically conductive contact-connection layer 500 is provided in a gap between sides of the light-emitting diode element 102 and the covering unit 120 that lie opposite one another. The gap for receiving the contact-connection layer 500 is provided on account of the lower thickness of the light-emitting diode element 102 compared to the depth of the recess provided in the covering unit 120.

In accordance with different exemplary embodiments of the light-emitting diode apparatus 100, the electrically conductive contact-connection layer 500 is formed by an electrically conductive adhesive, an anisotropic adhesive, a silicone adhesive, a graphite foam or by sintering without pressure.

Figure 6:
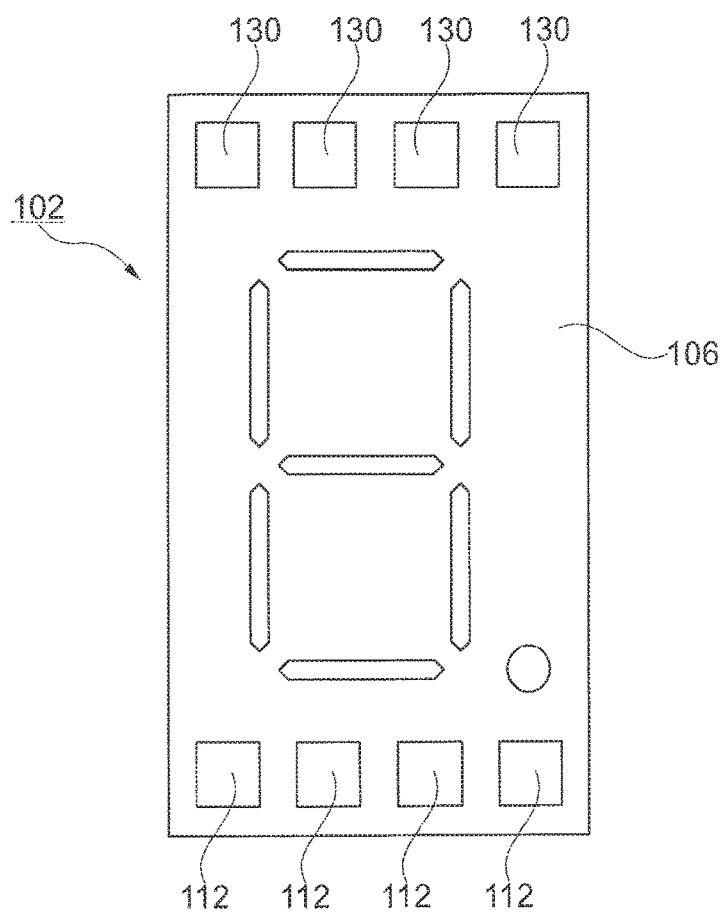
FIG. 6 shows an enlarged illustration of a front side of a light-emitting diode element of the light-emitting diode apparatus from FIG. 2 in accordance with an exemplary embodiment of the present invention.

FIG. 6 shows the front side 106 of the exemplary light-emitting diode element 102 in an enlarged view compared to the illustration in FIG. 2 and without the partial covering by the printed circuit board. Here, it can be readily identified that both the first diode connection contacts or anodes 112 and the second diode connection contacts 130 or cathodes of the light-emitting diode element 102 are guided toward the front for a front-side contact-connection of the light-emitting diode element 102.

FIGS. 2 to 6 show a contact-connection example for an embodiment of the light-emitting diode apparatus 100 proposed herein as a 7-segment-display chip having n contacts on the rear side of the light-emitting diode element 102. The anodes 112 can be electrically contact-connected to the first printed circuit board 104 by thermocompression, for example. The printed circuit board 104 can be formed, for example, of polyimide, glass fiber-reinforced epoxy resin, etc. The rear side of the display LED chips 102 is connected to the contact material 500 and is guided to the first printed circuit board 104 by means of the frame 302 using plated through-holes, the anodes 112 also being guided to said first printed circuit board. For the contact material 500, it is possible to use conductive adhesive, sintering paste, anisotropic adhesive, graphite foam, electrically conductive paste, etc.

In accordance with an alternative exemplary embodiment, the rear-side contact-connection can also be carried out by means of a wire bonding method. The contact-connection and separation is either provided on the first printed circuit board 104 or by a multi-layer embodiment of the further printed circuit board 300 on the rear side. The further printed circuit board 300 either has cutouts for the chips 102 or forms the covering plate 120 together with the spacing plate 302. In this case, the spacing plate 302 has cutouts and is thicker than the chips 102. The covering plate 120 is closed and serves for protecting the LED arrangement 102 on the rear side; however, it can also be used as a further electrical connection, for example by means of a plug, to a drive unit.

Figure 7:
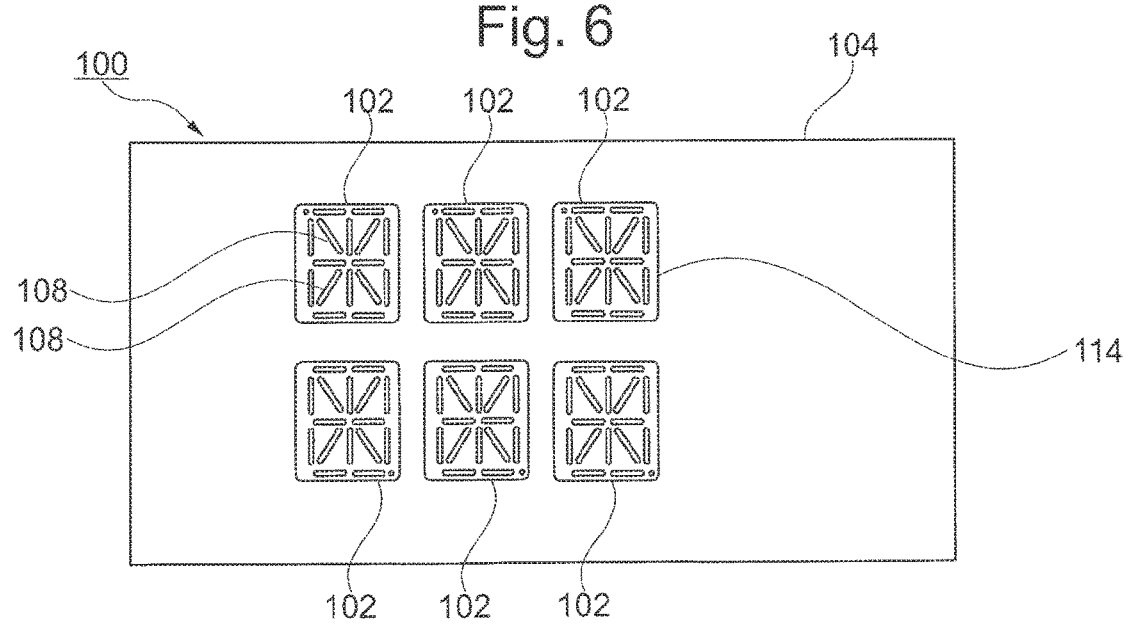
FIG. 7 shows a schematic illustration of a light-emitting diode apparatus in accordance with a further exemplary embodiment of the present invention.

FIG. 7 shows a schematic illustration of a light-emitting diode apparatus 100 in accordance with a further exemplary embodiment of the present invention. The plan view in FIG. 7 shows that this exemplary embodiment of the light-emitting diode apparatus 100 has a multiplicity of six light-emitting diode elements 102. The light-emitting diode elements 102 are each embodied here as 16-segment-display chips and are arranged underneath one another in two rows of in each case three chips 102. Each light-emitting diode element 102 has 16 emission regions 108, of which only two are provided with a reference numeral in the illustration for the sake of clarity.

Six through-openings 114 are provided in the printed circuit board 104 according to the number of light-emitting diode elements 102, only one through-opening being provided with a reference numeral in the illustration for the sake of clarity. The six through-openings 114 are arranged in the printed circuit board 104 in such a way that they uncover the view of the emission regions 108 of the light-emitting diode elements 102. Additional diode connection contacts of the light-emitting diode elements 102, not shown in the illustration of FIG. 7, are electrically conductively contact-connected to the printed circuit board 104 by means of additional board connection contacts, likewise not shown.

Figure 8:
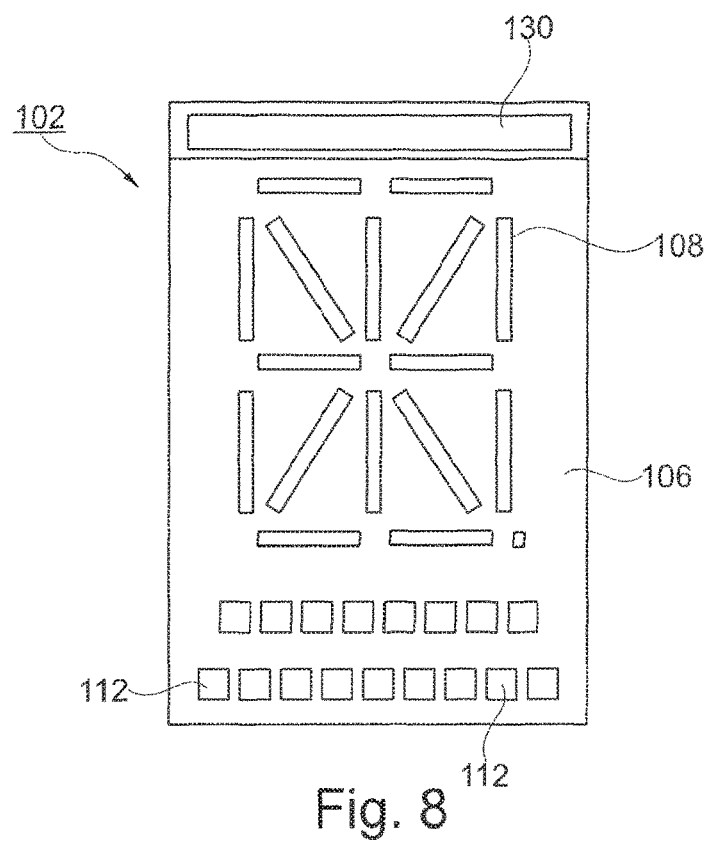
FIG. 8 shows an illustration of a light-emitting diode element in accordance with an exemplary embodiment of the present invention.

FIG. 8 shows a detailed illustration of an exemplary front side 106 of one of the six light-emitting diode elements 102 of the exemplary embodiment of the light-emitting diode apparatus 100 presented in FIG. 7. In the view that is enlarged in comparison to the illustration in FIG. 7, the front side 106 is shown without the partial covering through the printed circuit board. Here, it can be readily identified that a multiplicity of n diode connection contacts 112 is associated with the 16 emission regions 108. In the exemplary embodiment shown in FIG. 8, the diode connection contacts 112 form the anodes of the light-emitting diode elements 102. Only two of the diode connection contacts 112 are provided with a reference numeral in FIG. 8 for the sake of clarity.

In the exemplary embodiment shown in FIG. 8, all 16 emission regions 108 have a common second diode connection contact 130, which in this case forms the cathode of the light-emitting diode elements 102. As the illustration in FIG. 8 shows, both the first diode connection contacts or anodes 112 and the second diode connection contact 130 or cathode of the light-emitting diode element 102 are guided toward the front for a front-side contact-connection of the light-emitting diode element 102.

In the exemplary embodiment of the light-emitting diode apparatus 100 shown in FIGS. 7 and 8, said light-emitting diode apparatus is embodied as a 2×3×16-segment-display chip, in which the anodes 112 and the cathodes 130 are soldered on the same side 106. The contact-connection of the anodes 112 and cathodes 130 can be formed, in accordance with exemplary embodiments, by soldering, adhesive bonding or thermocompression bonding the six 16-segment-display chips 102 in two rows on the first printed circuit board 104 having the openings 114 for the purpose of viewing the emission areas 108 of the LED display chips 102. The anodes 112 and cathodes 130 of the LED chips 102 are guided upward in this example. A rear-side contact of the LED chips 102 is therefore not necessary.

The second printed circuit board, not shown in FIGS. 7 and 8, has either cutouts for the chips 102 or consists of two successively connected printed circuit boards, the first of which has openings for the chips 102 and is thicker than the chips 102 and the second of which is closed. They serve for protecting the LED arrangement at the rear. If the anodes 112 and cathodes 130 of the LED chips 102 are not guided to the front, in accordance with alternative exemplary embodiments, then rear-side contact-connection takes place, as is explained in connection with FIG. 1.

Figure 9:
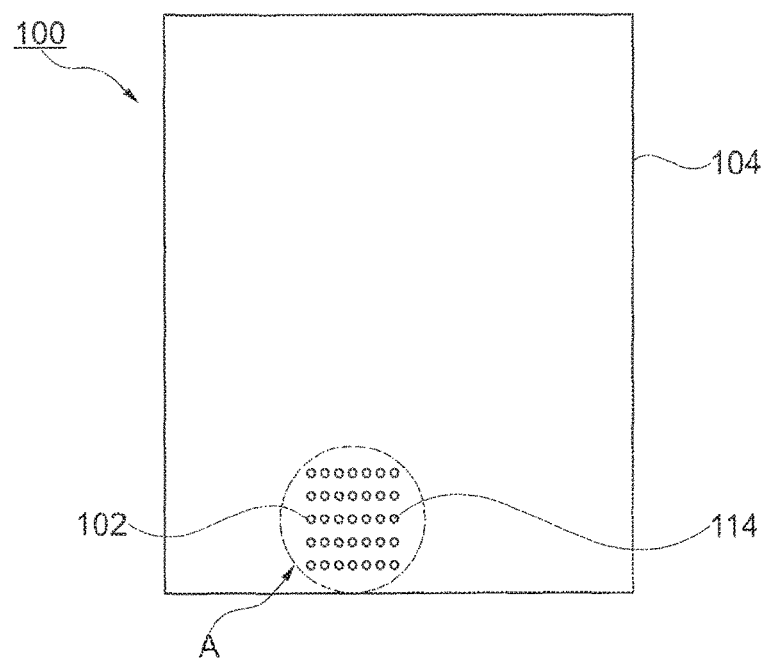
FIG. 9 shows a plan view of a light-emitting diode apparatus in accordance with a further exemplary embodiment of the present invention.

FIG. 9 shows a plan view of a light-emitting diode apparatus 100 in accordance with a further exemplary embodiment of the present invention. Here, a five-line array of 35 light-emitting diode elements 102 is provided for the purpose of forming a 5×7 dot matrix. Only one light-emitting diode element 102 is provided with a reference numeral for the sake of clarity. As in the previous exemplary embodiments, a multiplicity of suitably positioned through-openings 114 in the printed circuit board 104 corresponding to the multiplicity of light-emitting diode elements 102 is also provided here, said multiplicity of through-openings uncovering the view of the emission regions of the light-emitting diode elements 102.

Figure 10:
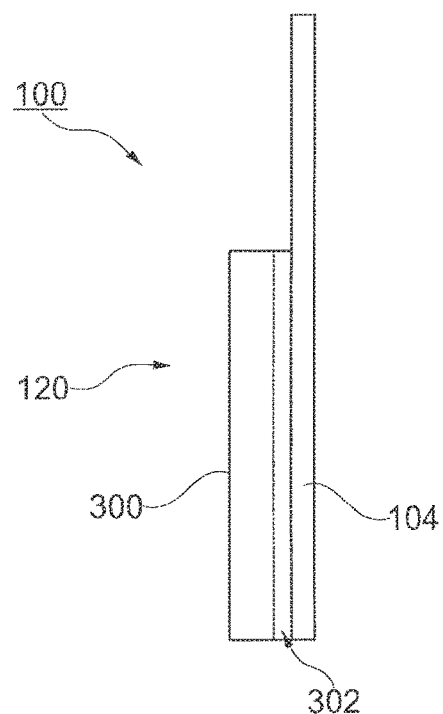
FIG. 10 shows a side view of the light-emitting diode apparatus from FIG. 8 in accordance with an exemplary embodiment of the present invention.

FIG. 10 shows a side view of a stacked construction of the exemplary light-emitting diode apparatus 100 from FIG. 9, in accordance with an exemplary embodiment of the present invention. In this exemplary embodiment as well, the printed circuit board 104 is connected to a covering unit 120, wherein the light-emitting diode elements (not shown in FIG. 10) are arranged in a recess (likewise not shown in FIG. 10) in the covering unit 120. As in the exemplary embodiment shown in FIG. 3, the covering unit 120 is also composed here of a further printed circuit board 300 and a frame element 302 that serves as a spacing plate.

Figure 11:
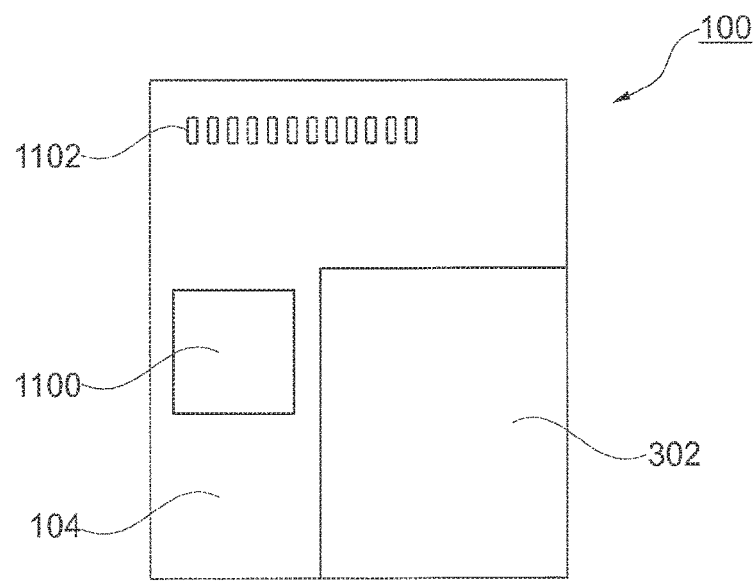
FIG. 11 shows a bottom view of the light-emitting diode apparatus from FIG. 8 in accordance with an exemplary embodiment of the present invention.

FIG. 11 shows a bottom view or rear view of the light-emitting diode apparatus 100 from FIG. 9 in accordance with an exemplary embodiment of the present invention. A driver circuit 1100 that is arranged on a rear side of the printed circuit board 104 alongside the covering plate or the frame element 302 for the purpose of driving the light-emitting diode element and a multiplicity of driver contacts 1102 for the purpose of electrically contact-connecting the driver circuit 1100 are shown.

Figure 17:
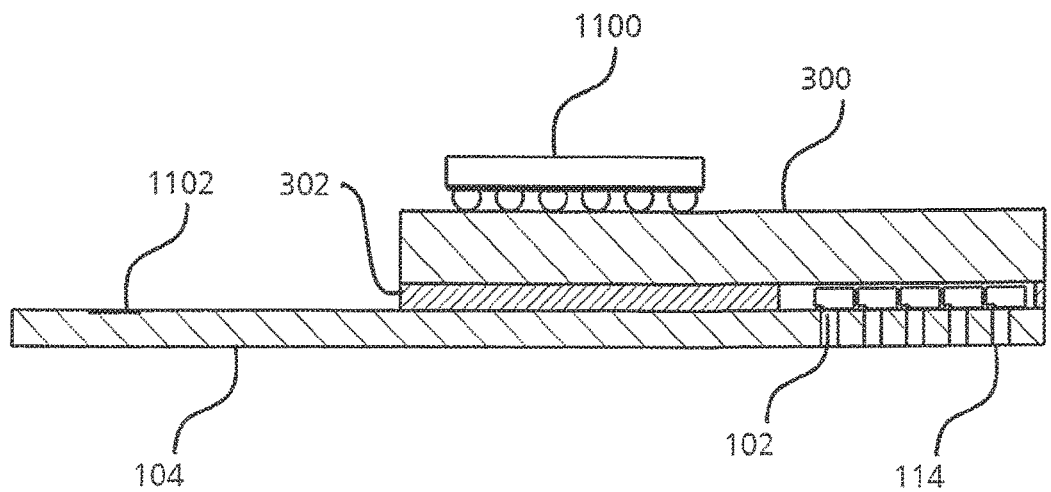
FIG. 17 shows a further advantageous embodiment of a light-emitting diode apparatus in accordance with a further exemplary embodiment of the present invention.

FIG. 17 shows a sectional illustration of the light-emitting diode apparatus of a further advantageous exemplary embodiment of the present invention. A driver circuit 1100 that is arranged on a rear side of the further printed circuit board 300 for the purpose of driving the light-emitting diode element and a multiplicity of driver contacts 1102 that is arranged on the printed circuit board 104 for the purpose of electrically contact-connecting the driver circuit 1100 are shown. The frame element and the further printed circuit board have plated through-holes (not shown) for the purpose of electrical connection. The light-emitting diode apparatus of this exemplary embodiment has a plurality of through-openings 114 and a plurality of light-emitting diodes 102. In further modifications (not illustrated), it is also possible for only one through-opening and/or only one light-emitting diode element to be present.

Figure 18:
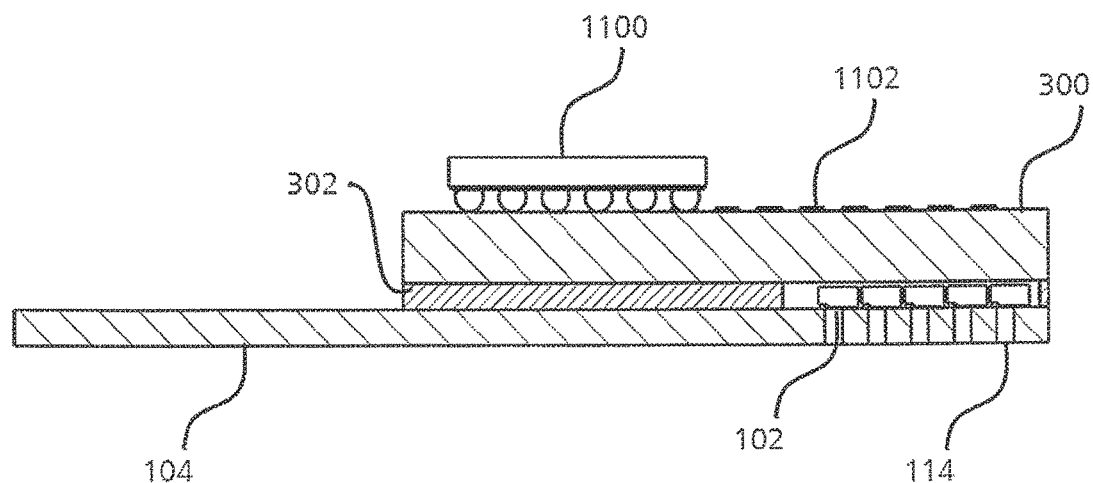
FIG. 18 shows a further advantageous embodiment of a light-emitting diode apparatus in accordance with a further exemplary embodiment of the present invention.

FIG. 18 shows a further modification of the exemplary embodiment according to FIG. 17. In this exemplary embodiment, the multiplicity of driver contacts 1102 are arranged on the further printed circuit board 300.

Figure 12:
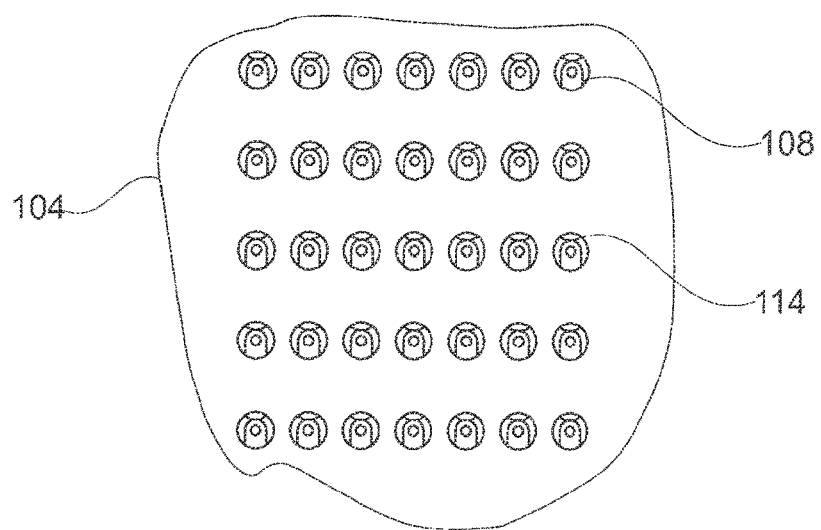
FIG. 12 shows a portion of a detail of the light-emitting diode apparatus from FIG. 8 in accordance with an exemplary embodiment of the present invention.

FIG. 12 shows a section of a detail of the light-emitting diode apparatus 100 in accordance with an exemplary embodiment of the present invention, said section of a detail being denoted with the reference numeral A in FIG. 9. It can be readily identified here that the multiplicity of light-emitting diode elements 102 that form the dot matrix are LED point emitters. In the exemplary embodiment shown in the illustration, the respective emission regions 108 of the point emitters 102 have an emission face having a diameter of 100 μm. Said diameter is optional and can also be designed to be larger or smaller. The printed circuit board 104 is positioned opposite the array of light-emitting diode elements 102 in such a way that the emission regions 108 are aligned in each case centrally opposite the contours of the through-openings 114 in the printed circuit board 104.

Figure 13:
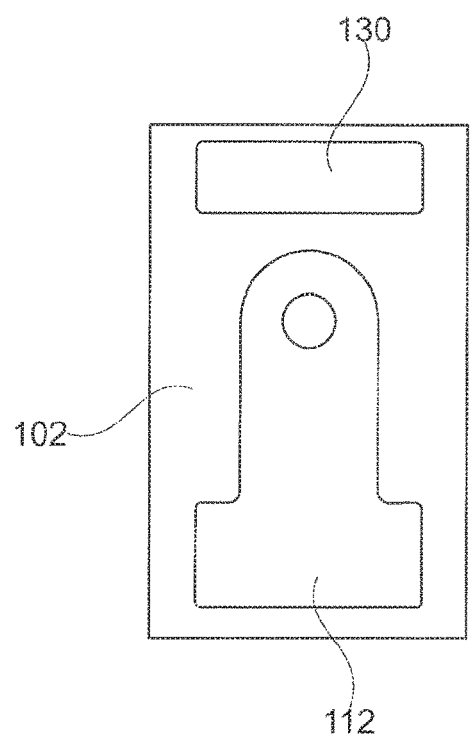
FIG. 13 shows an illustration of a light-emitting diode element of the light-emitting diode apparatus from FIG. 8 in accordance with an exemplary embodiment of the present invention.

FIG. 13 shows a basic illustration of one of the exemplary point emitters 102 of the 5×7 dot matrix LED from FIG. 9. However, the diode connection contact 112 and the second diode connection contact 130 are guided to the front for front-side contact-connection of the LED chip 102.

The exemplary embodiment of the light-emitting diode apparatus 100 presented in FIGS. 9 to 13 concerns an alphanumeric 5×7 dot matrix LED. The, in this case 35, LED chips 102 are contact-connected to the first printed circuit board 104 for the purpose of forming a 5×7 dot matrix by soldering, adhesive bonding or thermocompression bonding, said first printed circuit board having openings 114 for the purpose of viewing the emission areas 108. In this example, point emitters having a circular emission face with a diameter of 100 μm are selected as the LED chips 102. The anode 112 and cathode 130 of the LED chips 102 are guided upward in this example. A rear-side contact-connection of the LED chip 102 is therefore not necessary. The conductor tracks and the connection of electrical interfaces, for example plugs, and drive units, for example the LED driver 1100, can be guided both to the first printed circuit board 104 and to the second printed circuit board 300.

The covering unit 120 has either cutouts for the chips 102 or consists of two successively connected printed circuit boards 300, 302, the first of which has openings for the chips 102 and is embodied to be thicker than the chips 102 and the second of which is closed. They serve for protecting the LED arrangement 102 at the rear. If the anodes 112 and cathodes 130 of the LED chips 102 are not guided to the front, in accordance with alternative exemplary embodiments, then rear-side contact-connection takes place, as is explained in connection with FIG. 1.

Figure 14:
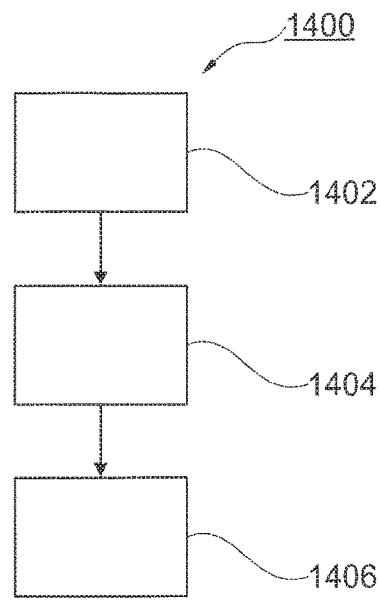
FIG. 14 shows a flow diagram of a method for producing a light-emitting diode apparatus in accordance with an exemplary embodiment of the present invention.

FIG. 14 shows a flow diagram of an exemplary embodiment of a method 1400 for producing a light-emitting diode apparatus. The method 1400 can be carried out for the purpose of producing one of the exemplary light-emitting diode apparatuses 100 presented in the preceding figures.

In a provision step 1402, a light-emitting diode element having a front side and a rear side is provided. In this case, the front side has an emission region for the purpose of emitting electromagnetic waves and a diode connection contact associated with the emission region. In a further provision step 1404, a printed circuit board having a through-opening and a board connection contact is provided. In a joining step 1406, the front side of the light-emitting diode element is connected to the printed circuit board in such a way that the emission region is arranged opposite the through-opening and the diode connection contact is arranged opposite the board connection contact and is electrically conductively connected to the board connection contact.

Figure 15:
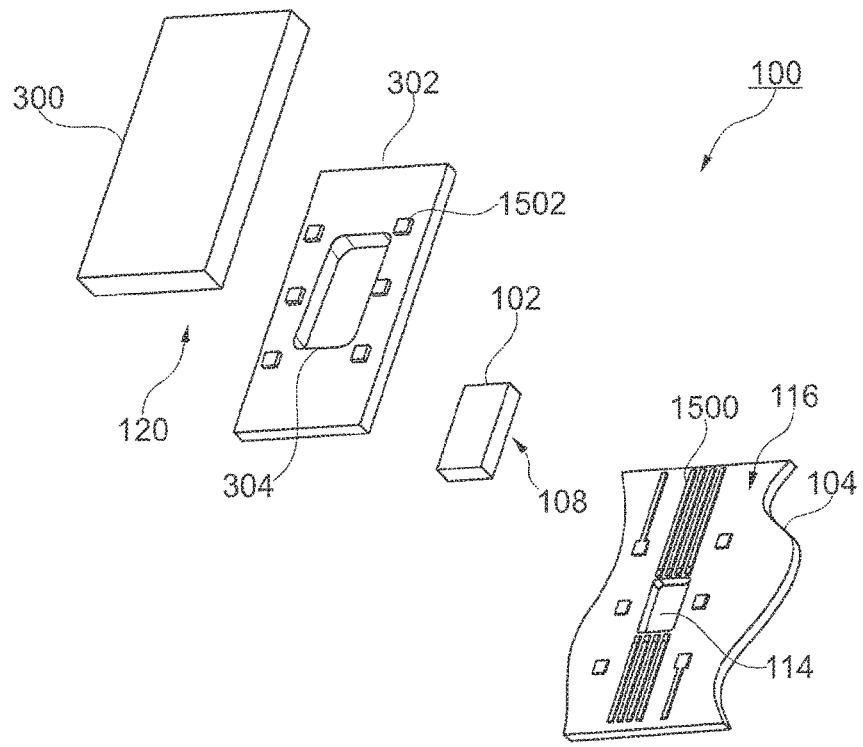
FIG. 15 shows an exploded illustration of a light-emitting diode apparatus that is to be produced in accordance with the method from FIG. 14, viewed on a first main side of the elements, in accordance with an exemplary embodiment of the present invention.

FIG. 15 shows an exploded illustration of an exemplary light-emitting diode apparatus 100 that is to be produced in accordance with an exemplary embodiment of the method 1400 from FIG. 14. The printed circuit board 104 having the through-opening 114, the light-emitting diode element 102 and the covering unit 120 composed of the further printed circuit board 300 and the frame element 302 are shown. The printed circuit board 104 is shown viewed on the side 116 facing the light-emitting diode element 102. This side 116 of the printed circuit board 104 has electrical lines 1500 for contact-connection of the printed circuit board 104.

In the manufacturing process, in the joining step 1406, the light-emitting diode element 102 having the emission region 108 is placed face down in an aligned manner on the side 116 of the printed circuit board 104 opposite the through-opening 114. Then, the frame element 302 is placed on the side 116 of the printed circuit board 104 in such a way that the light-emitting diode element 102 is received in the passage opening 304 of the frame element 302. The exemplary frame element 302 shown in FIG. 15 has plated through-holes 1502 for the purpose of guiding a cathode of the light-emitting diode element 102 to the front of the printed circuit board 104. Lastly, the further printed circuit board 300 is placed on the frame element 302 and connected thereto for the purpose of electrical contact-connection and/or protection of the light-emitting diode element 102.

Figure 16:
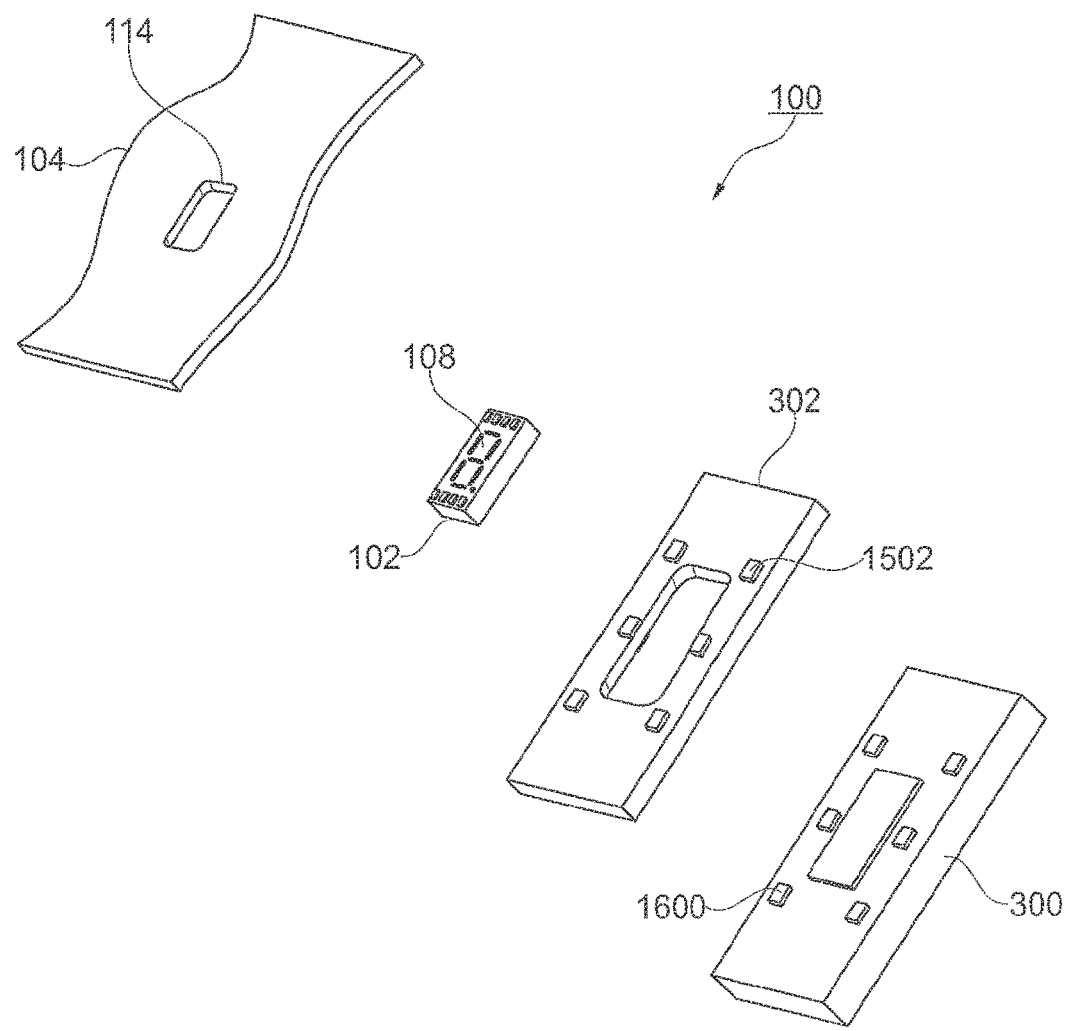
FIG. 16 shows an exploded illustration of a light-emitting diode apparatus that is to be produced in accordance with the method from FIG. 14, viewed on a second main side of the elements, in accordance with an exemplary embodiment of the present invention.

FIG. 16 shows, with reference to a further exploded illustration, the LED arrangement 100 from FIG. 15 viewed from a viewing direction opposite to the viewing direction in FIG. 15. Here, the emission region 108 of the light-emitting diode element 102 can be seen, said emission region being visible to the human eye through the through-opening 114 of the printed circuit board 104 in the finished state of the light-emitting diode apparatus 100. As the illustration in FIG. 16 shows, the further printed circuit board 300 also has plated through-holes 1600.

In accordance with one embodiment of the production method 1400 from FIG. 14, in the joining step 1406, the LED chip 102 is electrically contact-connected to the emission side 108 face down on the printed circuit board 104. The printed circuit board 104 comprises the opening 114, which permits a clear view of all the emission regions 108, for example, of a 7-segment-display LED chip as the light-emitting diode element 102. The individual emission regions 108, for example segments, decimal point, can be electrically contact-connected, for example, by various soldering methods or gold bump compression. In this case, the contact-connection faces 1500 on the printed circuit board 104 correspond exactly to the bond contact pattern on the display LED chip 102 in terms of dimensions and spacings.

The polarity of the display LED chips 102 is usually such that the emission regions 108 are p-conducting as the anode and the mating contact on the rear side of the chip is n-conducting as the cathode. Chips 102 having a reversed polarity are likewise constructed, only in this case the anode and cathode are interchanged when current is supplied. The common rear-side contact—usually the cathode—can also be guided to the front, to the emission side 108 and contact-connected. No contact-connection is then required on the rear side of the chip and all electrical contacts are located on one plane.

In the improved LED chip arrangement 100 presented herein, a wire bonding method for electrically contact-connecting the light-emitting diode element 102 can be dispensed with for the purpose of miniaturization and reducing costs. In the case of a multi-line construction of display arrays, the spacings between individual light-emitting diode elements 102 can therefore be designed to be so small that undistorted coupling into optical beam paths can be realized.

In the illustration of alphanumeric information, the improved LED chip arrangement 100 presented here can ensure a proportionally suitable appearance of the LED display.

It is possible to dispense with extraction of many bonding wires, as a result of which the potential for error can be reduced and operating times can be shortened. It is likewise possible to omit protection of bonding wires that are open after wire bonding by additional working steps of casting, encapsulating and covering for the purpose of ensuring stability.

Dispensing with the bonding wires means that light reflections, which distort the information that is actually to be reproduced and which can lead to irritation for the user, no longer arise. A covering of the bonding wires with absorbent potting material or with a covering cap that is usually costly when using bonding wires to avoid irritations is therefore likewise no longer required.

In a light-emitting diode apparatus produced in accordance with the design presented here, the yield of good chips does not decrease automatically with chip size and the development of costs remains within a manageable range. The problem of mechanical protection and the prevention of reflections of the bonding wires has been solved in a cost-effective manner.

Using the proposed approach, all digits of an array can further comprise individual contacts (cathode or anode). The luminous segments or points can be contact-connected and guided individually or together. Furthermore, multiplex circuits can be constructed, which can be operated with fewer electrical connections.

The exemplary embodiments described and shown in the figures are selected purely by way of example. Different exemplary embodiments may be combined with one another in full or in relation to individual features. It is also possible to supplement an exemplary embodiment with features of a further exemplary embodiment. Furthermore, it is possible for method steps according to the invention to be repeated and to be carried out in a different sequence to that described.

If one exemplary embodiment comprises an "and/or" conjunction between a first feature and a second feature, this should be read as meaning that the exemplary embodiment, in accordance with one embodiment, has both the first feature and the second feature and, in accordance with a further embodiment, has either only the first feature or only the second feature.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A light-emitting diode apparatus, comprising:
   a light-emitting diode element having a front side and a rear side,
      wherein the front side has an emission region for emitting electromagnetic waves and a first diode connection contact associated with the emission region,
      wherein the rear side of the light emitting diode element has a second diode connection contact;
   a printed circuit board having a through-opening and a board connection contact,
      wherein the front side of the light-emitting diode element is connected to the printed circuit board, and
      wherein the emission region is arranged opposite the through-opening and the first diode connection contact is arranged opposite the board connection contact and is electrically conductively connected to the board connection contact; and
   a covering unit having a recess for receiving the light-emitting diode element and having a covering unit contact,
      wherein the covering unit is connected to the printed circuit board and the light-emitting diode element is arranged in the recess,
      wherein the covering unit contact is arranged opposite the second diode connection contact and is electrically connected to the second diode connection contact,
      wherein the covering unit is composed of a further printed circuit board and a frame element that abuts the further printed circuit board, and
      wherein the recess is formed by a passage opening in the frame element.

2. The light-emitting diode apparatus as claimed in claim 1, wherein the front side of the light-emitting diode element has a further emission region for emitting further electromagnetic waves and a further diode connection contact associated with the further emission region,
   wherein the printed circuit board has a further board connection contact, and
   wherein the further emission region is arranged opposite the through-opening and the further diode connection contact is arranged opposite the further board connection contact and is electrically conductively connected to the further board connection contact.

3. The light-emitting diode apparatus as claimed in claim 1, wherein a depth of the recess exceeds a thickness of the light-emitting diode element.

4. The light-emitting diode apparatus as claimed in claim 1, wherein the covering unit is connected to the rear side of the light-emitting diode element by means of an electrically conductive contact-connection layer.

5. The light-emitting diode apparatus as claimed in claim 1, wherein the printed circuit board has a second board connection contact,
   wherein the covering unit has a further covering unit contact and an electrical line that electrically conductively connects the covering unit contact and the further covering unit contact, and wherein the further covering unit contact is arranged opposite the second board connection contact and is electrically conductively connected to the second board connection contact.

6. The light-emitting diode apparatus as claimed in claim 1, wherein the front side of the light-emitting diode element has a third diode connection contact associated with the emission region and the printed circuit board has a second board connection contact, and
wherein the third diode connection contact is arranged opposite the second board connection contact and is electrically conductively connected to the second board connection contact.

7. The light-emitting diode apparatus as claimed in claim 1, further comprising:
at least one additional light-emitting diode element,
wherein the printed circuit board has at least one additional through-opening and at least one additional board connection contact, and
wherein an additional emission region of the additional light-emitting diode element is arranged opposite the additional through-opening and an additional diode connection contact of the additional light-emitting diode element is arranged opposite the additional board connection contact and is electrically conductively connected to the additional board connection contact.

8. The light-emitting diode apparatus as claimed in claim 1, further comprising:
a driver circuit for driving the light-emitting diode element; and
at least one driver contact for electrically contact-connecting the driver circuit,
wherein the driver circuit and/or the driver contact are arranged on the printed circuit board.

9. The light-emitting diode apparatus as claimed in claim 1, further comprising:
a driver circuit for driving the light-emitting diode element and
at least one driver contact for electrically contact-connecting the driver circuit,
wherein the driver circuit and/or the driver contact are arranged on the further printed circuit board.

10. A method for producing a light-emitting diode apparatus, comprising:
providing a light-emitting diode element having a front side and a rear side,
wherein the front side has an emission region for the purpose of emitting electromagnetic waves and a first diode connection contact associated with the emission region, and
wherein the rear side of the light-emitting diode element has a second diode connection contact;
providing a printed circuit board having a through-opening and a board connection contact;
joining the light-emitting diode element to the printed circuit board,
wherein the front side of the light-emitting diode element is connected to the printed circuit board, and
wherein the emission region is arranged opposite the through-opening and the first diode connection contact is arranged opposite the board connection contact and is electrically conductively connected to the board connection contact; and
providing a covering unit having a covering unit contact, wherein the covering unit contact is arranged opposite the second diode connection contact and is electrically connected to the second diode connection contact.

11. The light-emitting diode apparatus as claimed in claim 1, wherein the light-emitting element is a 7-segment-display chip comprising a plurality of connection contacts on the rear side of the light-emitting element.

12. The light-emitting diode apparatus as claimed in claim 1, further comprising additional light-emitting elements,
wherein the light-emitting element is a 16-segment-display chip and each of the additional light-emitting elements is a 16-segment-display chip arranged proximate to the light-emitting element.

13. The light-emitting diode apparatus as claimed in claim 1, wherein the frame element comprises a plated through-hole for an electrical connection between the second diode connection contact and the board connection contact.

14. A light-emitting diode apparatus, comprising:
a light-emitting diode element having a front side and a rear side, the front side of the light-emitting diode element having an emission region for emitting electromagnetic waves and a first diode connection contact and the rear side of the light-emitting diode element having a second diode connection contact;
a printed circuit board having a through-opening and a board connection contact, the board connection contact being connected to the first diode connection contact; and
a covering unit having a recess for receiving the light-emitting diode element and having a covering unit contact, the covering unit being connected to the printed circuit board,
wherein the light-emitting diode element is arranged in the recess and the emission region is arranged opposite the through-opening, and
wherein the covering unit contact is electrically connected to the second diode connection contact.

15. The light-emitting diode apparatus as claimed in claim 14, wherein the covering unit is formed as one integral part.

16. The light-emitting diode apparatus as claimed in claim 15, wherein the covering unit contact is arranged within the recess.

17. The light-emitting diode apparatus as claimed in claim 1, wherein the covering unit comprises an electrical line connecting the covering unit contact and the board connection contact.

* * * * *